(12) United States Patent
Arekar et al.

(10) Patent No.: US 9,872,419 B1
(45) Date of Patent: Jan. 16, 2018

(54) TRANSCEIVER MODULE HAVING IMPROVED METAL HOUSING FOR EMI CONTAINMENT

(71) Applicant: FOXCONN INTERCONNECT TECHNOLOGY LIMITED, Grand Cayman (KY)

(72) Inventors: Chaitanya Arekar, Dubun, CA (US); David Meadowcroft, San Jose, CA (US); Sanjeev Gupta, Santa Rosa, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/395,668

(22) Filed: Dec. 30, 2016

(51) Int. Cl.
| | |
|---|---|
| H05K 9/00 | (2006.01) |
| H05K 7/14 | (2006.01) |
| H05K 5/04 | (2006.01) |
| H05K 5/00 | (2006.01) |
| H05K 5/03 | (2006.01) |
| H01R 12/71 | (2011.01) |
| H01R 13/6581 | (2011.01) |
| G02B 6/42 | (2006.01) |

(52) U.S. Cl.
CPC .......... *H05K 9/0009* (2013.01); *G02B 6/428* (2013.01); *G02B 6/4256* (2013.01); *G02B 6/4277* (2013.01); *H01R 12/714* (2013.01); *H01R 13/6581* (2013.01); *H05K 5/0026* (2013.01); *H05K 5/03* (2013.01); *H05K 5/04* (2013.01)

(58) Field of Classification Search
CPC ...... H05K 9/0009; H05K 5/04; H05K 5/0026; H05K 5/03; H01R 12/714; H01R 13/6581; G02B 6/428; G02B 6/4277; G02B 6/4256
USPC .......................... 174/350; 361/800, 816, 818
See application file for complete search history.

(56) References Cited

U.S. PATENT DOCUMENTS

| | | | |
|---|---|---|---|
| 7,387,538 B2 | 6/2008 | Engel et al. | |
| 2004/0198079 A1* | 10/2004 | Aronson | G02B 6/4201 439/76.1 |
| 2007/0123090 A1* | 5/2007 | Kim | G02B 6/4201 439/372 |
| 2007/0224884 A1* | 9/2007 | Engel | H01R 13/6658 439/607.01 |
| 2009/0176401 A1* | 7/2009 | Gu | G02B 6/4201 439/372 |
| 2010/0130063 A1 | 5/2010 | Lang et al. | |
| 2012/0148201 A1* | 6/2012 | Kondou | G02B 6/4245 385/92 |
| 2012/0288240 A1* | 11/2012 | Kondo | G02B 6/426 385/92 |

(Continued)

*Primary Examiner* — Sherman Ng
(74) *Attorney, Agent, or Firm* — Wei Te Chung; Ming Chieh Chang

(57) ABSTRACT

A transceiver module includes a printed circuit board and a metal housing enclosing the printed circuit board and defining a front opening, the metal housing including a base portion and a cover portion, the base portion including two opposite side portions, the cover portion including two opposite fixing portions each engaged with a corresponding side portion; wherein each of the side portions defines a gap having an outside opening on an outside wall thereof, each of the fixing portions includes a top portion inwardly extending from a top end thereof, and the top portion is inserted in a corresponding gap.

20 Claims, 12 Drawing Sheets

(56) References Cited

U.S. PATENT DOCUMENTS

2014/0270657 A1* 9/2014 McColloch .............. G02B 1/10
385/92

* cited by examiner

TRANSCEIVER MODULE HAVING IMPROVED METAL HOUSING FOR EMI CONTAINMENT

BACKGROUND OF THE INVENTION

1. Field of the Invention

The present invention relates to a transceiver module, and more particularly to a transceiver module having metal housing with a better electromagnetic interference (EMI) containment.

2. Description of Related Arts

With increased module density in switches, meeting EMI performance has become increasingly difficult. This is especially true for small form factor modules. Further increased module data speed demands better EMI containment solution. For EMI containment, the general approach is to seal the gaps in the mechanical assembly. Generally, top and bottom housing (which form cover for the transceivers) are made from metal die casting and epoxy is used to bridge the gap between the top and the bottom housing. However, application of epoxy is time consuming and also application process is not consistent (varies considerably from operator to operator). Industry also uses EMI gasket to bridge the gap between the top and bottom housing but at an additional cost of the gasket and glue that is required to hold the gasket. Newer approach is to use sheet metal as top housing and die casting as the bottom housing. This approach is cost effective but still requires the use of epoxy to bridge the gap for consistent performance. And use of EMI gaskets can be an alternative at additional cost.

U.S. Pat. No. 7,387,538, issued to Engel et al. on Jun. 17, 2008, discloses a transceiver module including an elongated base and housing. The housing is formed of a conductive material, such as sheet metal, and has C-shaped buckle portions for mounting to openings of the elongated base.

SUMMARY OF THE INVENTION

An object of the present invention is to provide a transceiver module having an improved metal housing with a better EMI performance.

To achieve the above-mentioned object, a transceiver module includes a printed circuit board and a metal housing enclosing the printed circuit board and defining a front opening, the metal housing including a base portion and a cover portion, the base portion including two opposite side portions, the cover portion including two opposite fixing portions each engaged with a corresponding side portion; wherein each of the side portions defines a gap having an outside opening on an outside wall thereof, each of the fixing portions includes a top portion inwardly extending from a top end thereof, and the top portion is inserted in a corresponding gap.

According to the present invention, the transceiver module having a metal housing with a fixing portion capable of improving the shielding effect.

DETAILED DESCRIPTION OF THE PREFERRED EMBODIMENT

Figure 1:
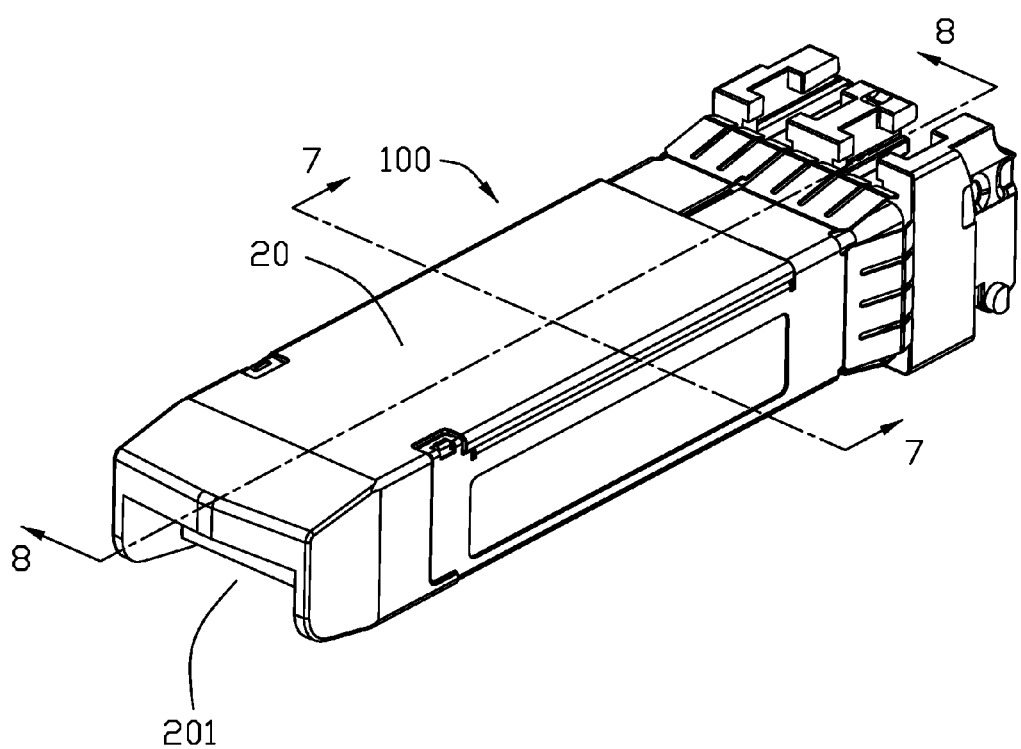
FIG. 1 is a perspective view of a first embodiment of a transceiver module in accordance with present invention.
Figure 2:
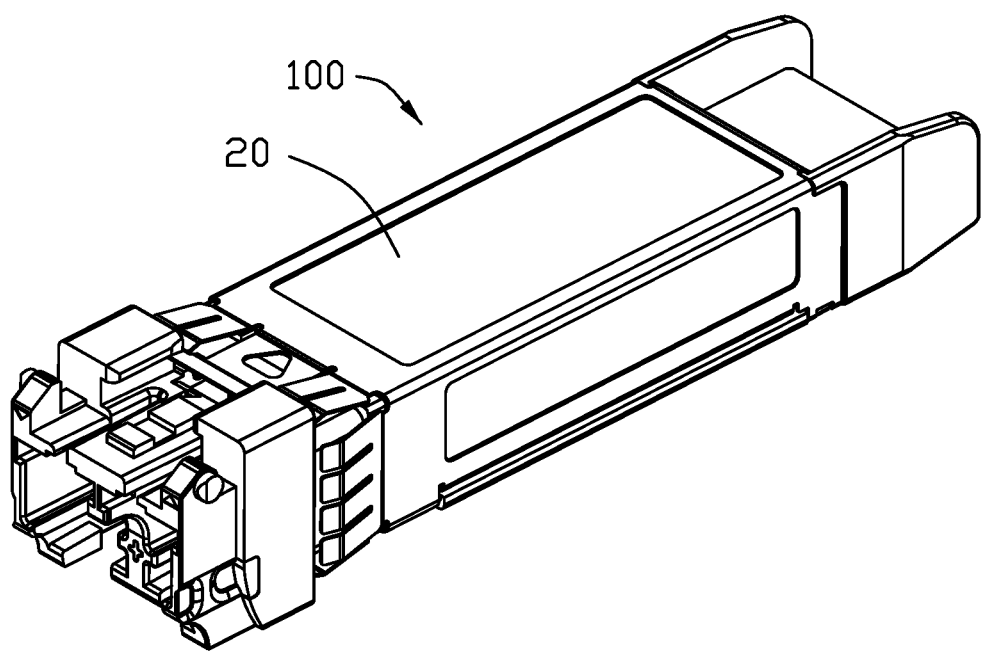
FIG. 2 is perspective view similar to FIG. 1, but from a different perceptive.
Figure 3:
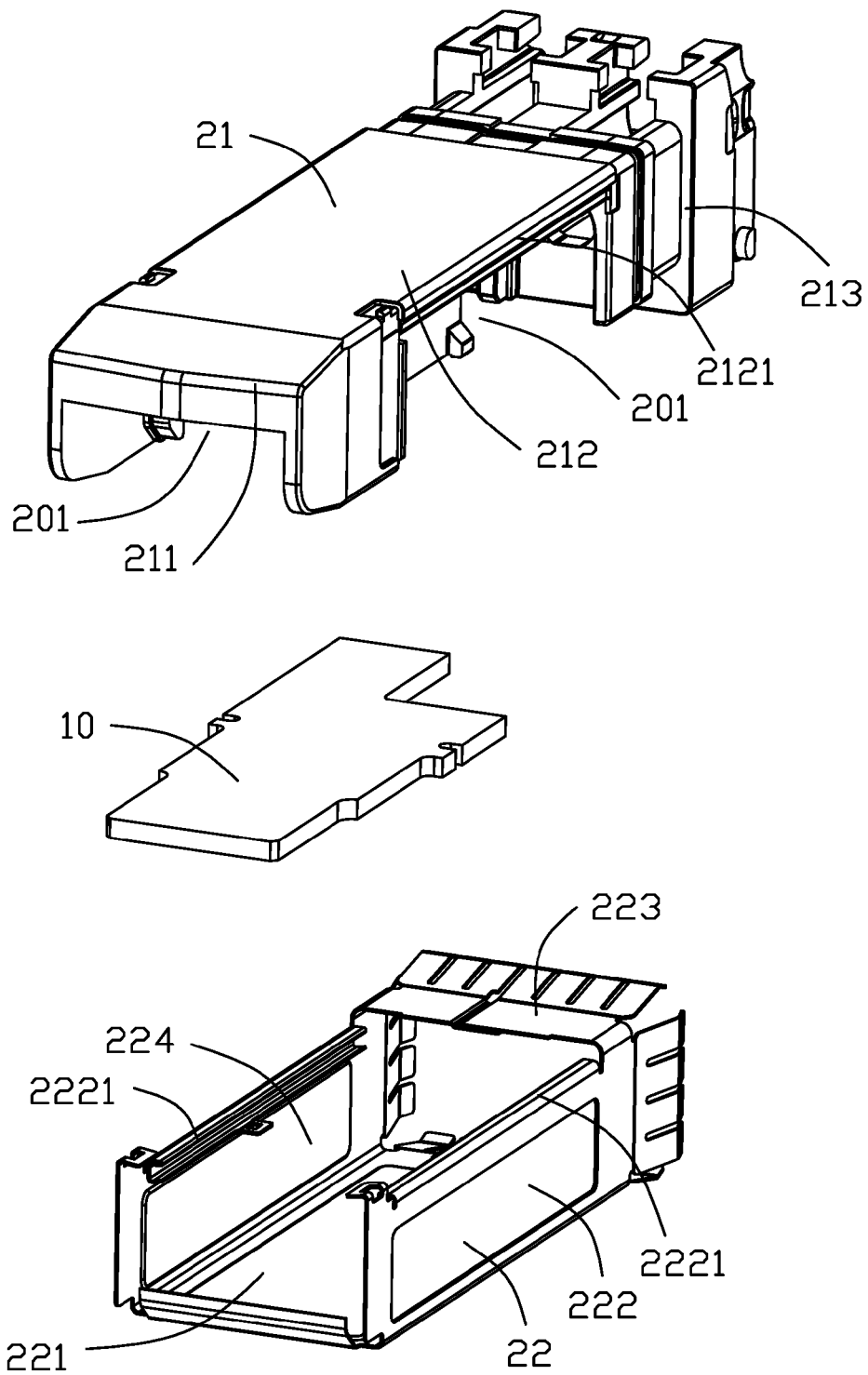
FIG. 3 is an exploded view of the transceiver module as shown in FIG. 1.
Figure 4:
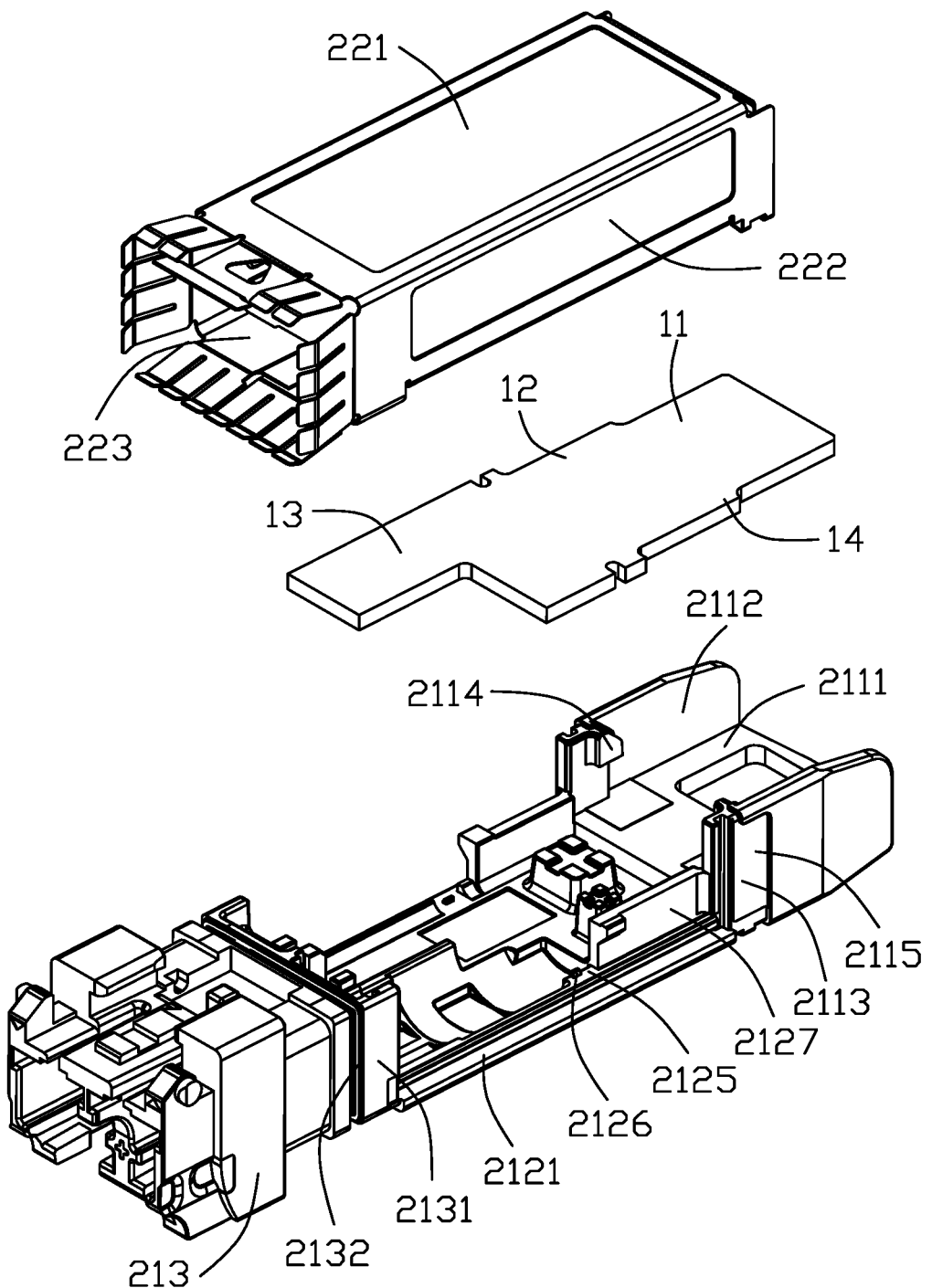
FIG. 4 is an exploded view similar to FIG. 3, but from a different perspective.
Figure 5:
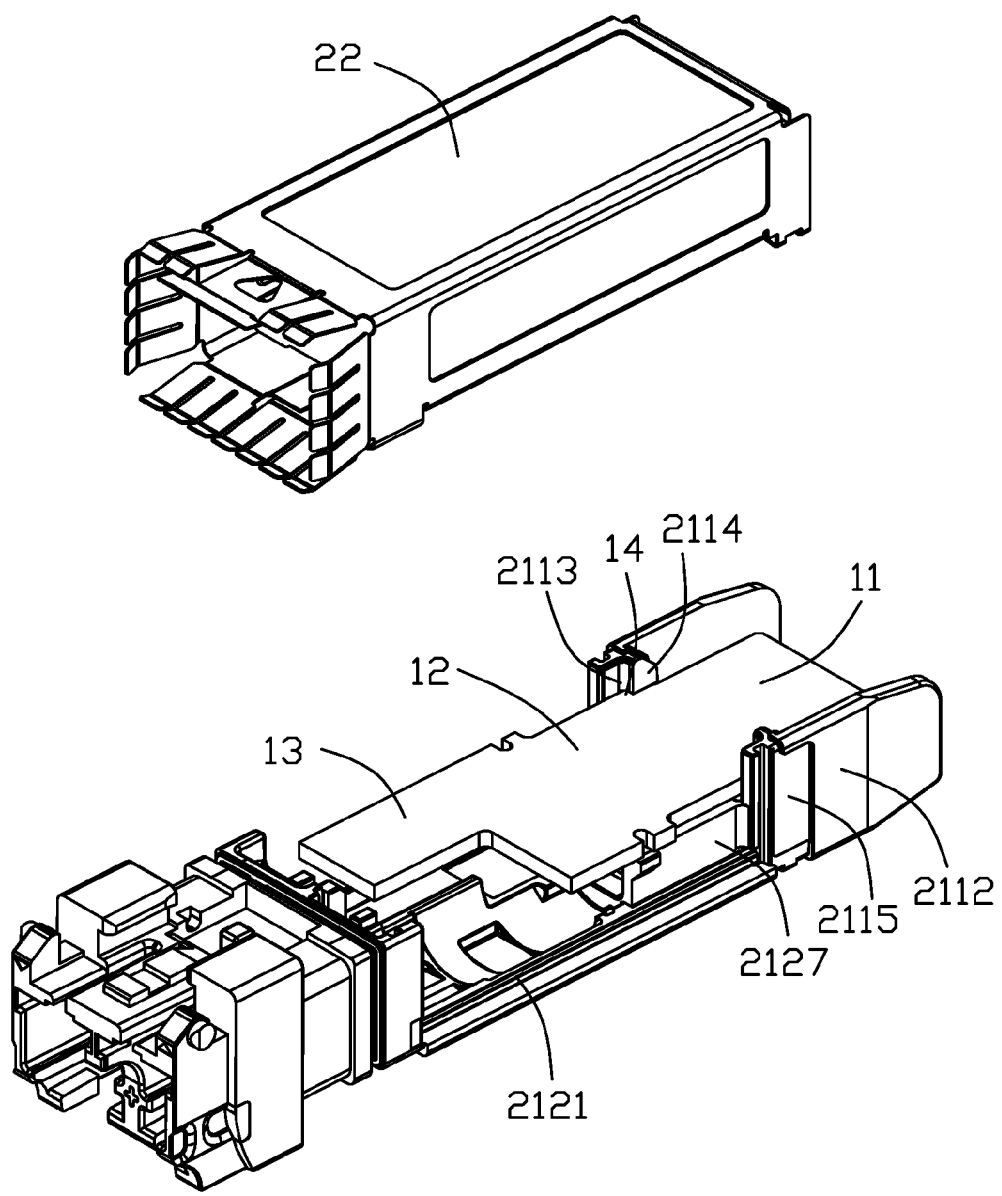
FIG. 5 is a partly exploded view of the cable connector as shown in FIG. 2.
Figure 6:
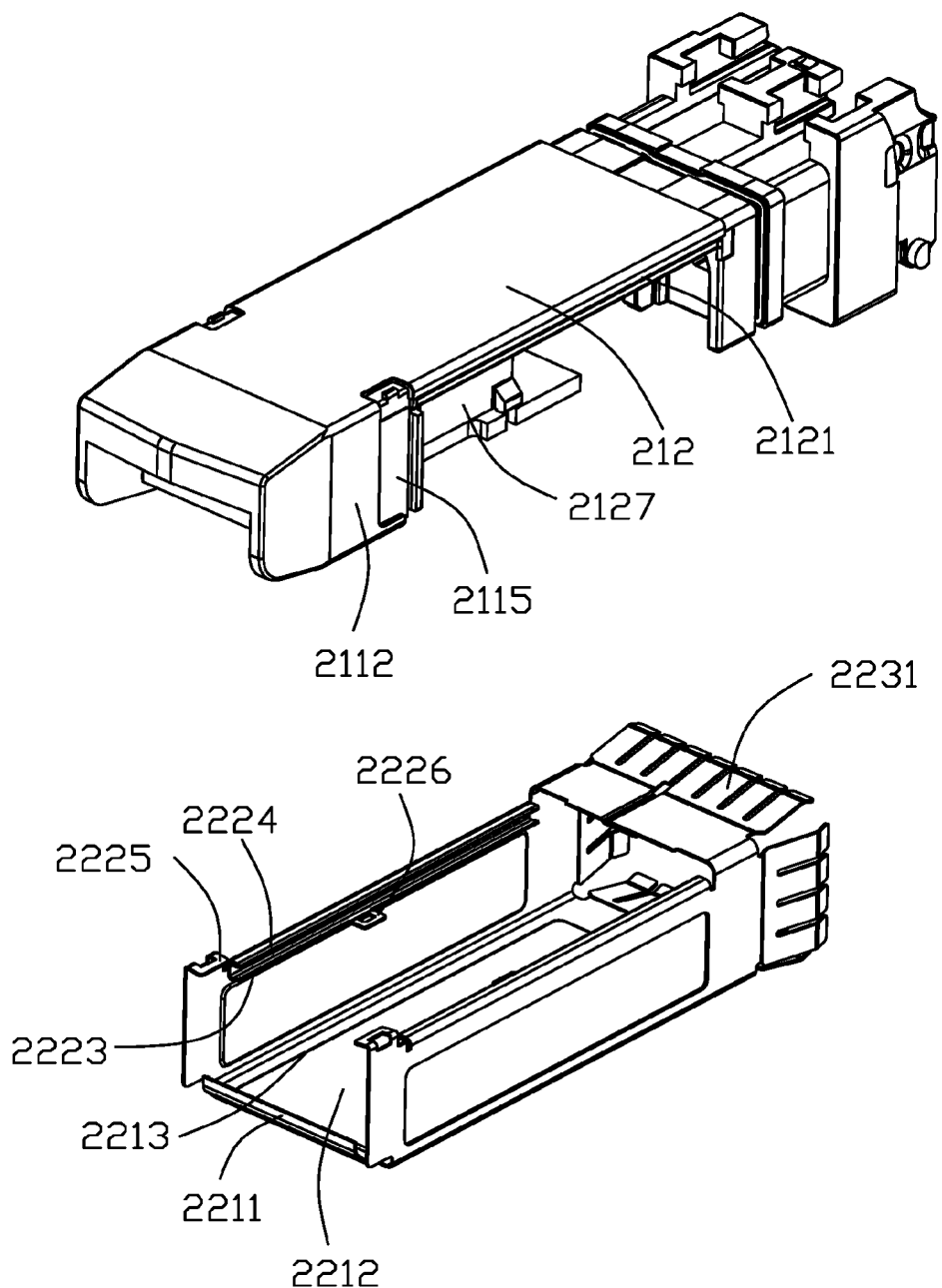
FIG. 6 is a partly exploded view of the cable connector as shown in FIG. 1.
Figure 7:
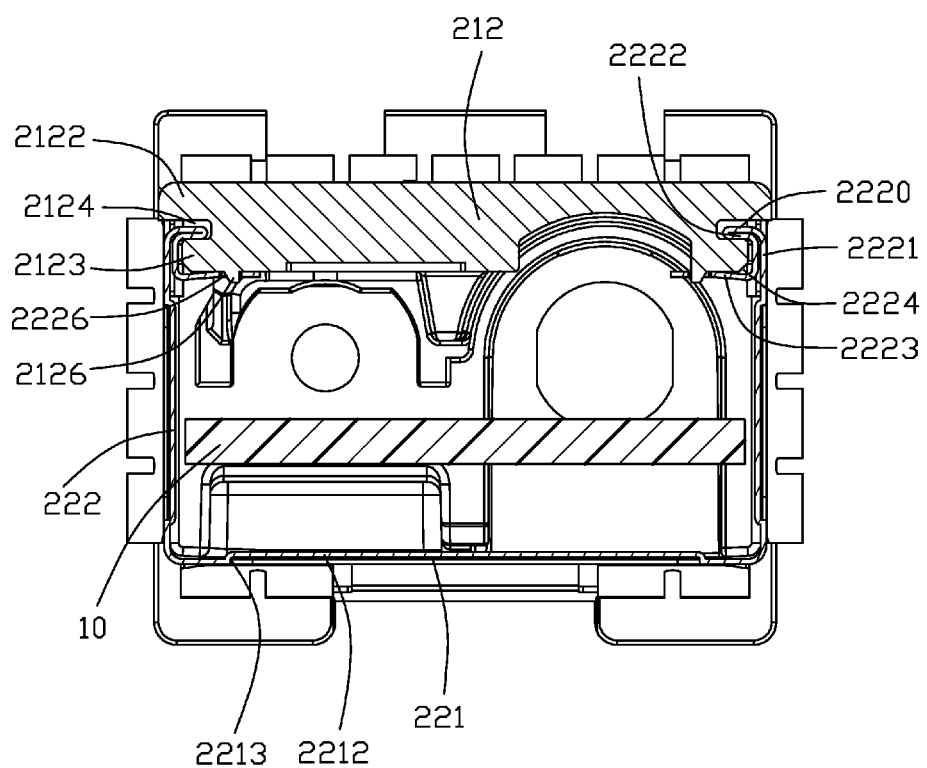
FIG. 7 is a cross-sectional view of the cable connector taken along line 7-7 in FIG. 1.
Figure 8:
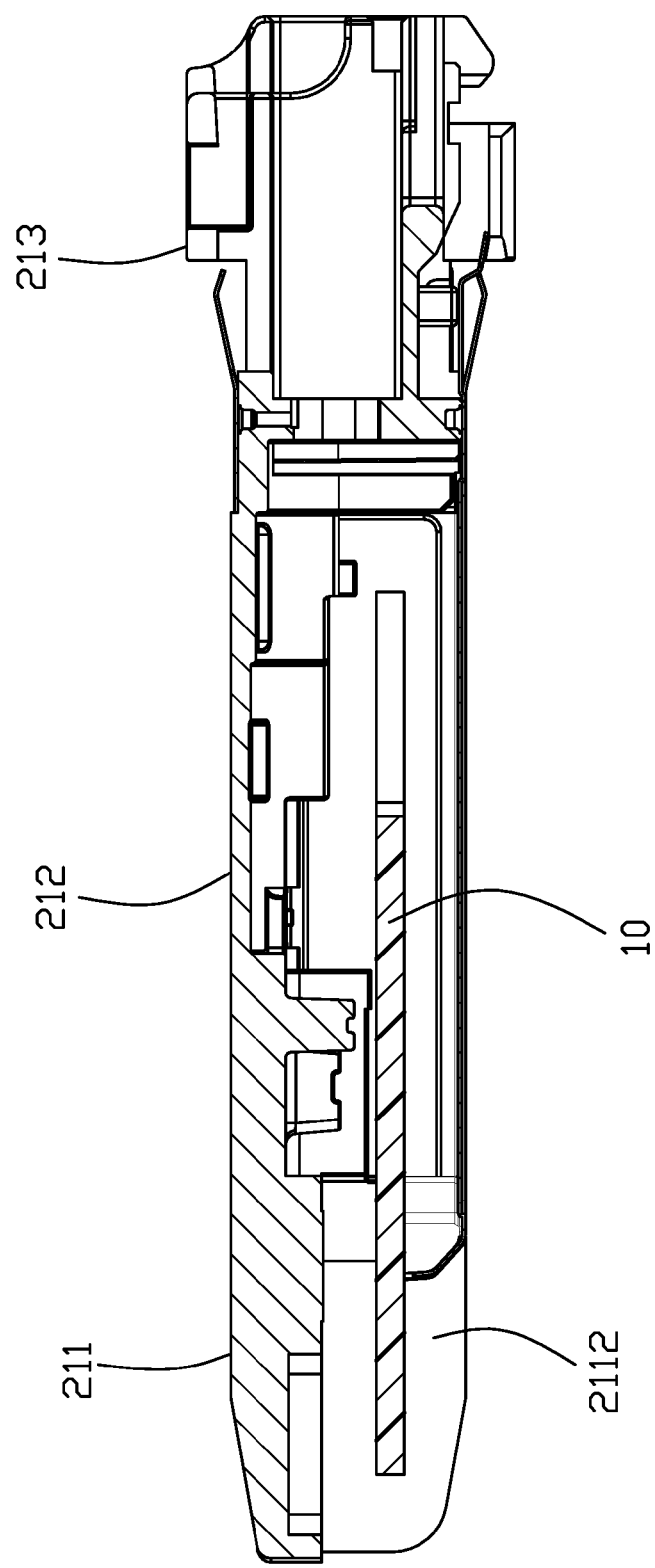
FIG. 8 is a cross-sectional view of the cable connector taken along line 8-8 in FIG. 1.

Reference will now be made in detail to a preferred embodiment of the present invention. Referring to FIGS. 1 to 8, a first embodiment of a transceiver module 100 includes printed circuit board 10 for being optically connected between an optical fiber cable (not shown) and an electrical mating connector (not shown) on the mother board (not shown), and a metal housing 20 defining a hollow 201 to enclose the printed circuit board 10 and a part of the cable.

The metal housing 20 includes a rectangle base portion 21 extending along a docking direction and a cover portion 22 mated with the base portion 21 along a down-to-up/vertical direction.

The base portion 21 defines a mating end or inner mating port 211 for mating with the aforementioned electrical mating connector, a rear end or outer mating port 213 for coupling to a pair of optical fiber connectors, and a connecting portion 212 connected between the mating end 211 and rear end 213. The mating end 211 includes a top board 2111 and two side boards 2112 respectively and vertically extended form two opposite sides of the top board 211. Each of the side boards 2112 defines a positioning portion 2113 on a rear end thereof. Each of the positioning portions 2113 defines an extension block 2114 vertically and inwardly extending from an inside wall of the corresponding side board 2112, a front surface of which forms an inclined surface along a forward and upward direction. A depression portion 2115 is defined on an outside surface of a rear end of each side board 2112 and a bottom surface of the portion of the top board 2111 adjacent to the side board 2112. The connecting portion 212 includes two opposite side portions 2121 extending along the docking direction, each of which includes a top portion 2122, a bottom portion 2123 and a gap 2124 having an outside opening formed between the top portion 2122 and the bottom portion 2123. The distance between the outside walls of the top portions 2122 along a left-to-right direction is smaller than the distance between the outside walls of the bottom portions 2123 along the left-to-right direction. The left-to-right direction is perpendicular to the docking direction and the vertically direction. An inserting portion 2125 is inwardly extended from a central region of the bottom portion 2123, which has an inserting block 2126 vertically extending from a bottom surface of the inserting portion 2125. The connecting portion 212 further includes two spaced holding portions 2127 disposed behind the positioning portions 2113 and on a bottom side thereof. A front end of the rear end 213 includes four rear side walls 2131 connected end to end, and a top one of which is mechanically connected to a rear end of the connecting portion 212, and each of the rear side walls 2131 defines a retaining structure 2132 thereon.

The cover portion 22 include a bottom wall 221, two side walls 222 respectively and vertically extending from the opposite sides of the bottom wall 221 and a top side wall 223 connected between a rear end of the side walls 222, to form a receiving room for receiving the base portion 21. The width of the top side wall 223 along the docking direction is smaller than the width of the bottom wall 221, thus a mounting opening 224 is formed on a front side of the top side wall 223. Each of the side walls 222 defines a fixing portion 2221 on a top end thereof, to engage with the corresponding side portions 2121 of the base portion 21. Each of the fixing portions 2221 has a U-shaped cross section in a plane perpendicular to the docking direction. Each of the fixing portions 2221 is extended along the all length portions of the cover portion 22. Each of the fixing portion 2221 includes a top portion 2220 inwardly extending from a top end thereof, a striped top edge 2222 overlapping the top portion 2220 and outwardly extending from an inside end of the top portion 2220, a striped bottom edge 2223 inwardly extending and a slot 2224 having an inside opening between the top edge 2222 and the bottom edge 2223. A fixing ring 2226 is extended from a central region of each bottom edge 2223. The bottom wall 221 defines a mating portion 2211 forwardly and upwardly extending from a front end thereof, to engage with the inclined surface of the extension block 2114. Each of the side walls 222 defines a fixing plate 2225 vertically and inwardly extending from a front end thereof. The fixing plates 2225 are respectively received in the depression portions 2115 in the top board 2111, and the front ends of the side walls 222 are respectively received in the depression portions 2115 in the side boards 2112. A rear end of each of the bottom wall 221, the side walls 222 and the top side wall 223 extends to form a retaining portion 2231 for engaged with the retaining structure 2132, which includes a plurality of elastic sheets for achieving the flexibility of the retaining function. Each of the bottom wall 221 and the side walls 222 recessively defines a rectangular depressed area 2212. A pivoting portion 2213 is defined between the each side wall 222 and the adjacent side of the depressed area 2212. The pivoting portions 2213 are compliant points which enable the corresponding fixing portions 2221 of the side walls 222. In other words the pivoting portions 2213 are pivot points for the corresponding fixing portions 2221. The pivoting portions 2213 when pressed (compliance) allows the fixing portions 222 to be installed on the corresponding side portions 2121 of the base portion 21.

The printed circuit board 10 includes a first (inner end) portion 11, a second (middle) portion 12 rearwardly extending from the first portion 11 and a third (outer end) portion 13 rearwardly extending from the second portion 12. The width of the first portion 11 is smaller than the width of the second portion 12 along the left-to-right direction. The width of the second portion 12 is smaller than the width of the third portion 13 along the left-to-right direction. A step portion 14 is formed on the conjunction portion of the first portion 11 and the second portion 12. Understandably, the first portion 11 includes conductive pads (not shown) to mate with the aforementioned electrical mating connector (not shown) on the mother board (not shown).

When assembling of the transceiver module 100, the printed circuit board 10 is disposed on bottom of the base portion 21 from a down-to-up direction, simultaneously, the first portion 11 is disposed between the side board 2112, and a bottom surface of the printed circuit board 10 bears against the extension block 2114, and a front end of the second portion 12 of the printed circuit board 10 is held between two rear end of the positioning portions 2113, and the holding portions 2127 are disposed on the top surface of the second portion 12 of the printed circuit board 10. Understandably, other engagement means may be formed between the printed circuit board 10 and the base portion 21 to restrict the relative movements therebetween in the vertical direction, the front-to-back direction and the transverse direction. The base portion 21 is received in the receiving room of the cover portion 22, and the fixing plates 2225 are received in the depression portions 2115 in the top board 2111, and the front ends of the side walls 222 are received in the depression portions 2115 in the side boards 2112, and the retaining portions 2231 are fixed on the corresponding retaining structure 2132 of the base portion 21, simultaneously, the fixing portions 2221 of the cover portion 22 are engaged with the corresponding side portions 2121 of the base portion 21, each of the top portion 2220 together with the top edge 222 connected thereto being inserted into the corresponding gap 2124, the corresponding bottom portion 2123 of the side portion 2121 being received in the slot 2224 of the fixing portion 2221, the inserting block 2126 of the inserting portion 2125 being inserted into the corresponding fixing ring 2226.

Figure 9:
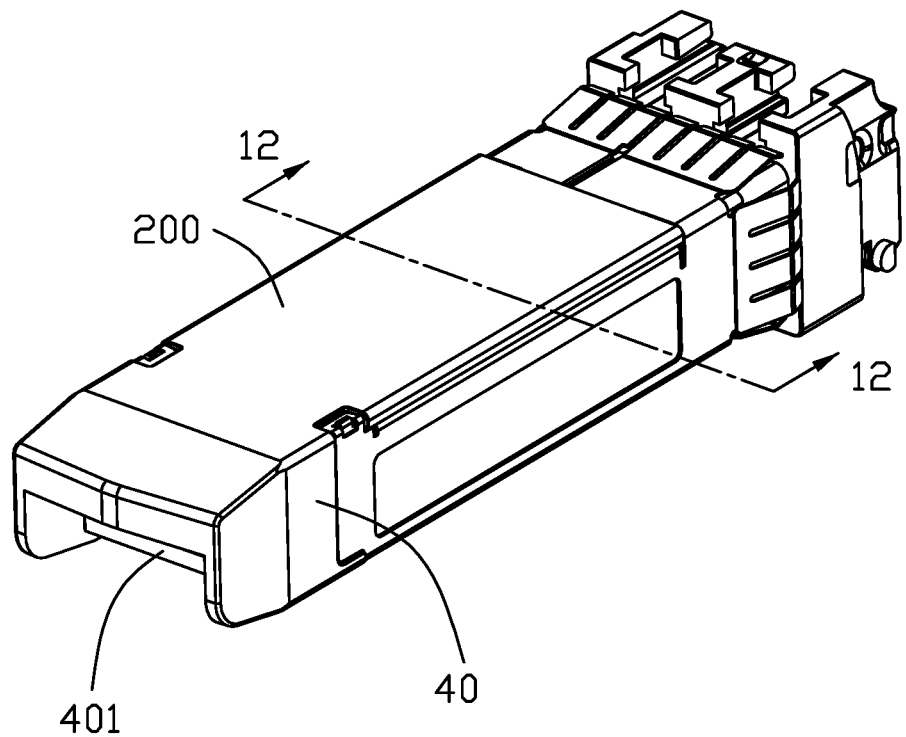
FIG. 9 is a perspective view of a second embodiment of a transceiver module in accordance with present invention.
Figure 10:
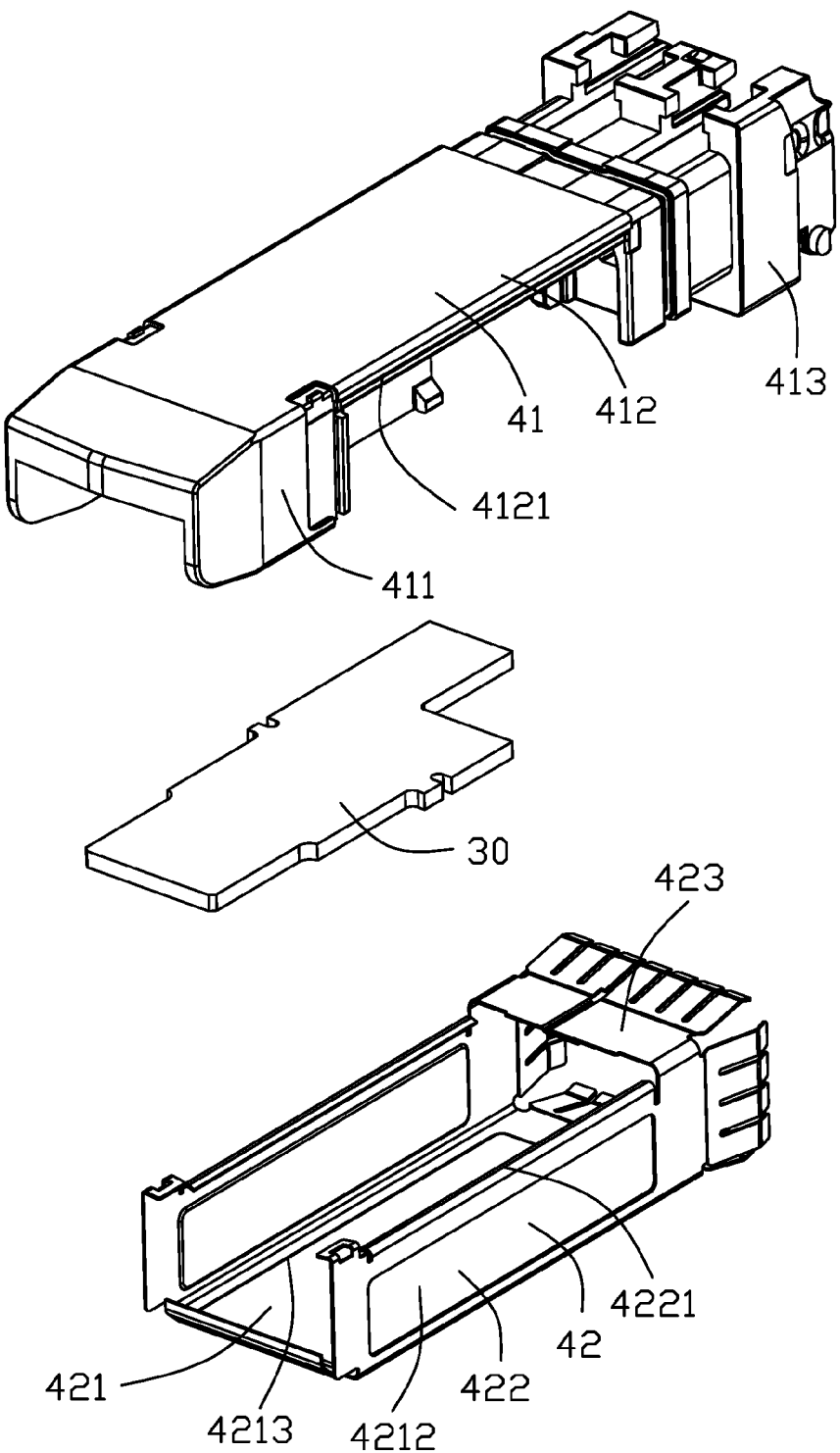
FIG. 10 is an exploded view of the cable connector as shown in FIG. 9.
Figure 11:
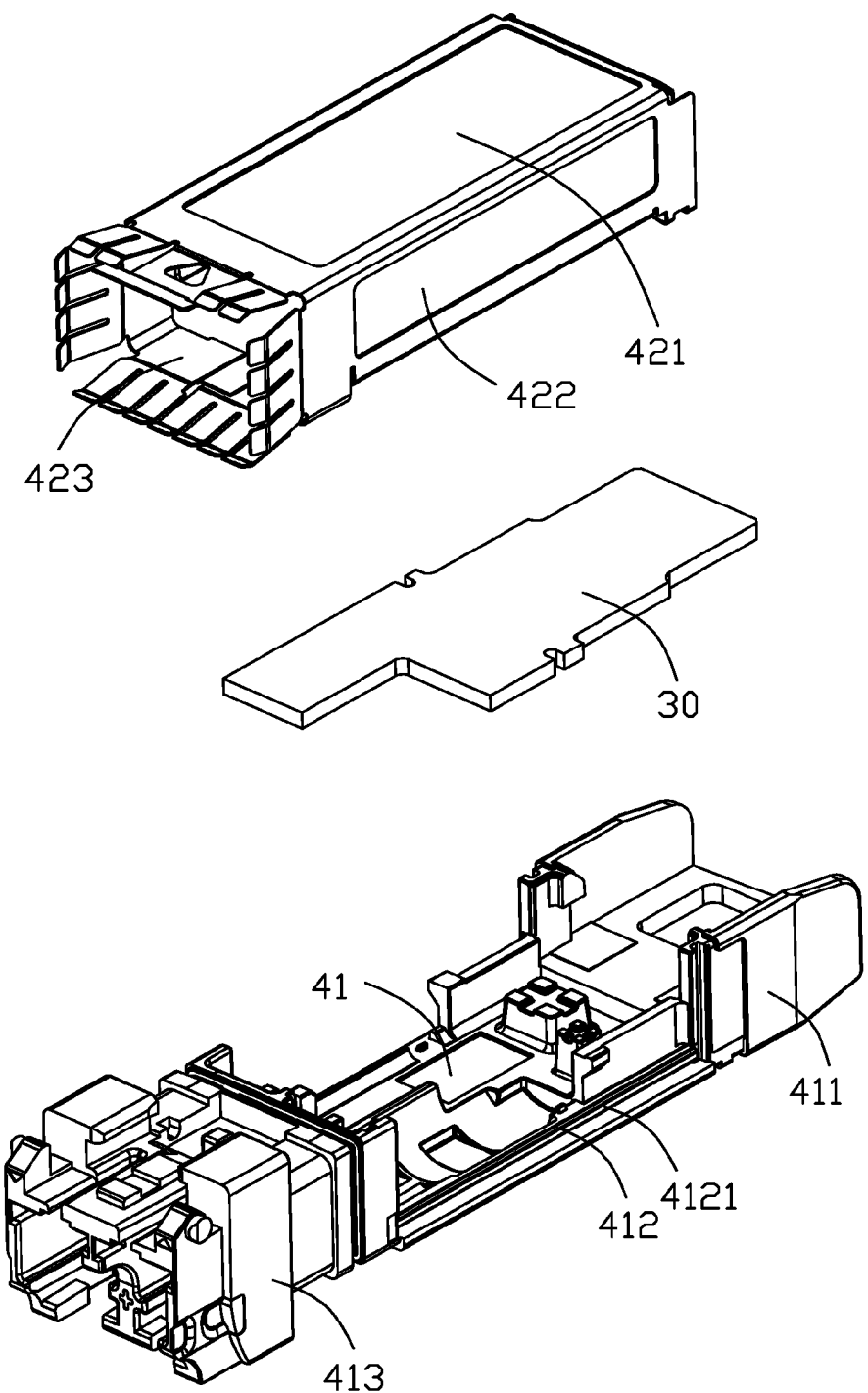
FIG. 11 is an exploded view similar to FIG. 10, but from a different perspective.
Figure 12:
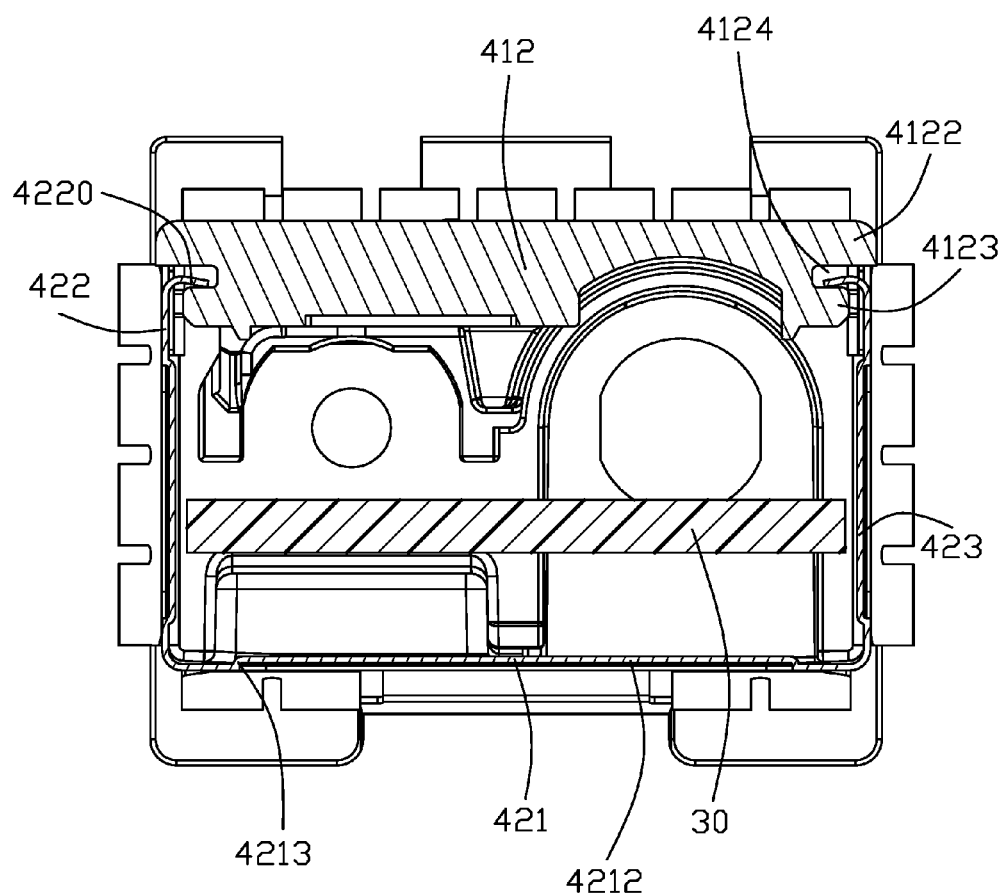
FIG. 12 is a cross-sectional view of the second embodiment of the transceiver module taken along line 12-12 in FIG. 9.

Referring to FIGS. 9 to 12, a second embodiment of a transceiver module 200 includes printed circuit board 30 and a metal housing 40 defining a hollow 401 to enclose the printed circuit board 30. the metal housing 40 includes a base portion 41 similar to the base portion 21 of the metal housing 20 and a cover portion 42 similar the cover portion 22 of the metal housing 20. The base portion 41 defines a mating end 411, a rear end 413 and a connecting portion 412 connected between the mating end 411 and rear end 413. The connecting portion 412 includes two opposite side portions 4121 similar to the side portions 2121. Each of the side portions 4121 includes a top portion 4122, a bottom portion 4123 and a gap 4124 having a side opening formed between the top portion 4122 and the bottom portion 4123. The cover portion 42 include a bottom wall 421, two side walls 422 vertically extending from the opposite sides of the bottom wall 421 and a top side wall 223 connected between two rear ends of the two side walls 422, to form a receiving room for receiving the base portion 41. Each of the side walls 422 defines a fixing portion 4221 on a top end thereof, to engage with the corresponding side portions 4121 of the base portion 41. In present embodiment, each of the fixing portions 4221 of the side walls 422 includes a top portion 4220 inwardly extending from a top end of the side wall 422, which forms an acute angle relative to the side wall 422. Each of the bottom wall 421 and the side walls 422 recessively defines a rectangular depressed area 4212. A pivoting portion 4213 is defined between the each side wall 422 and the adjacent side of the depressed area 4212. The pivoting portions 4213 are compliant points which imparts a snap feature to the corresponding fixing portions 4221 of the side walls 222. The pivoting portions 4213, when pressed compliantly, allows the fixing portions 422 to be installed on the corresponding side portions 4121 of the base portion 41.

When assembling of the transceiver module 200, the printed circuit board 30 is disposed on the bottom of the base portion 41 from an down-to-up direction. The base portion 41 is received in the receiving room of the cover portion 42, simultaneously, the fixing portions 4221 of the cover portion 42 are engaged with the corresponding side portions 4121 of the base portion 41, each of the top portion 4220 being inserted into the corresponding gap 4124, the corresponding bottom portion 4123 of the side portion 4121 bearing against a bottom surface of the op portion 4220.

The transceiver module 100 according to the present invention having fixing portions 2221 with a U-shaped cross section, the fixing portions 2221 are built as a part of metal housing 20 to improve the EMI containment/performance of the transceiver module 100. The fixing portions 2221 with a U-shaped cross section extend along the length direction of the cover portion 22 and form a tight fit to the base portion 21 preventing any EMI leakage, even if there is leakage from the gap between the fixing portion 2221 and the base portion 21. The fixing portions 2221 provide a longer leakage path for the EMI, improving the EMI performance. The fixing portions 2221 with a U-shaped cross section work like a snap fit on the base portion 21 which is easy to assembly and automation, compared to the prior art, no epoxy dispensing and no cleaning is required after the transceiver module 100. In other embodiment, the fixing portion 2221 can be a part of the cover portion 22 or run all along the length of the cover portion 22 (on either side). The fixing portions 2221 are built in the metal housing 20, it improves the functionality of the housing at no additional cost. The transceiver module 200 according to the present invention has fixing portions 4221 with a C-shaped cross section, and the fixing portions 4221 with a C-shaped cross section have a similar efficacy relative to the fixing portion 2221 with a U-shaped cross section.

It is noted that in the invention on one hand, the opposite mating ports of the metal housing 20 are formed by the rear end 213, i.e., an outer mating port, and the mating end 211, i.e., an inner mating port, of the rigid die-cast base portion 21 wherein the rear end 213 essentially forms a four-sided enclosed structure with opposite top and bottom sides and opposite lateral sides to form a pair of receiving cavities for protectively coupling to the pair of corresponding optical fiber connectors (not shown), and the mating end 211 forms a three-sided open structure with a top side and two opposite lateral sides for efficiently protectively shielding the inner end portion 11 of the printed circuit board 10 downwardly and sidewardly, so as to be rigid enough at both inner mating port 211 and outer mating port 213 for enduring repeated mating/coupling thereabouts. On the other hand, the mating end 211 is essentially open on the bottom side to allow the printed circuit board 10 to be conveniently located into the connecting portion 212 in the upward/vertical direction from an exterior before the resilient sheet-metal cover 22 is assembled upon the base portion 21. Understandably, two opposite side portions 2121 of the connecting portion 212 between the mating end 211 and the rear end 213 are intentionally lowered with a minimum height so as to save material for not only saving the cost but also reducing the weight of the whole transceiver module advantageously. In this embodiment, the cover 20 is terminated not to reach the inner mating port 211 because the aforementioned electrical mating connector (not shown) on the mother board (not shown) may be wholly intimately seated upon the mother board (not shown) while any portions of the cover 20 invading the inner mating port may interfere with it.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. It is understood that in the embodiment the corresponding optical connectors in the outer mating port and the corresponding optoelectronic devices on the printed circuit board 10 are not shown because all of them are traditional devices.

What is claimed is:

1. A transceiver module comprising:
a printed circuit board; and
a metal housing enclosing the printed circuit board and defining a front opening, the metal housing including a base portion and a cover portion, the base portion including two opposite side portions, the cover portion including two opposite fixing portions each engaged with a corresponding side portion; wherein
each of the side portions defines a gap having an outside opening in an outside wall thereof, each of the fixing portions includes a top portion inwardly extending from a top end thereof, and the top portion is inserted in a corresponding gap.

2. The transceiver module as recited in claim 1, wherein each of the side portions includes a top portion and a bottom portion, and the gap is disposed between the top portion and bottom portion, the distance between the outside walls of the top portion is greater than the distance between the outside walls of the bottom portion.

3. The transceiver module as recited in claim 2, wherein each of the fixing portions has a U-shaped cross section in a plane perpendicular to the docking direction, and each of the fixing portions further includes a top edge outwardly extending from an inside end of the top portion, a bottom edge inwardly extending and a slot having an inside opening disposed between the top edge and the bottom edge, each of the bottom portions is received in the corresponding slot of the fixing portion.

4. The transceiver module as recited in claim 3, wherein each of the bottom portion defines an inserting portion inwardly extending from a central region thereof, which has an inserting block vertically extending from a bottom surface of the inserting portion block, and a fixing ring is extended from a central region of each bottom edge, and the inserting blocks are inserted in the corresponding fixing ring.

5. The transceiver module as recited in claim 4, wherein the base portion defines a mating end with the front opening on a front end thereof, and the mating end includes a top board and two side boards respectively and vertically extended from the opposite sides of the top board, and a depression portion is recessively defined on the out surface of a rear end of each side board, and the cover portion includes a bottom wall and two side walls vertically extending from the opposite sides of the bottom wall, and a front end of each side wall is received in the corresponding depression portion in the side boards.

6. The transceiver module as recited in claim 5, wherein the base portion further include a connecting portion rearwardly extending from a rear end of the top board, and the side portions are defined on the opposite sides of the connecting portion and extend an overall length of the connecting portion, and each of the fixing portions extends along the overall length of the top end of a corresponding side wall.

7. The transceiver module as recited in claim 6, wherein the base portion further include a rear end mechanically connecting to a rear end of the connecting portion, and the cover portion further includes a top side wall connecting between a rear end of each side wall, and a rear end of each of the bottom wall, the side wall and the top side wall defines a retaining portion for engaged with the rear end of the base portion, which includes a plurality of elastic sheets for achieving the flexibility of the retaining function.

8. The transceiver module as recited in claim 5, wherein each of the side boards defines a positioning portion on a rear end thereof, and each of the positioning portions defines an extension block vertically and inwardly extending from an inside wall of the side board, and the printed circuit board is disposed between the side boards, the extension block bearing against a bottom surface of the printed circuit board.

9. The transceiver module as recited in claim 8, wherein a front end of the extension block forms an inclined surface along a forward and upward direction, and the bottom wall defines a mating portion forwardly and upwardly extending from a front end thereof to engage with the inclined surface of the extension block.

10. The transceiver module as recited in claim 5, wherein the depression portion is further defined recessing from the bottom surface of a portion of the top board adjacent to the side boards, and each of the side walls defines a fixing plate inwardly extending from a front end thereof, to being received in the depression portion in the top board, and the front end of the side wall.

11. A transceiver module comprising:
a printed circuit board including opposite inner end portion and outer end portion in a front-to-back direction;
a metallic housing enclosing said printed circuit board and including a metallic base portion made by a metallic die-casting process with strong rigidity thereof, and a metallic cover assembled, in a vertical direction perpendicular to said front-to-back direction, upon the base portion and made by stamping and forming sheet metal with resiliency thereof;
said base portion including an inner mating port in which said inner end portion of the printed circuit board is located, an outer mating port around which said outer end portion of the printed circuit board is located, and a connecting portion located between said inner mating port and said outer mating port in said front-to-back direction; wherein
the outer mating port defines a four-sided structure for coupling to at least one optical fiber connector, the inner mating port defines a three-sided structure to efficiently sidewardly and downwardly protectively shield the inner end portion of the printed circuit board; wherein
the cover includes a bottom wall and two opposite side walls assembled upon the connecting portion to commonly form a hollow configured to have the printed circuit board loaded along said vertical direction.

12. The transceiver module as claimed in claim 11, wherein the connecting portion defines a pair of side portions opposite to each other in a transverse direction perpendicular to both said vertical direction and said front-to-back direction with a height much less than those of both said outer mating port and said inner mating port in the vertical direction.

13. The transceiver module as claimed in claim 12, wherein each of said side walls of the cover includes a fixing portion snapped into a gap in each corresponding side portion of the connecting portion of the base portion.

14. The transceiver module as claimed in claim 12, wherein each of said side walls of the cover includes a horizontal fixing ring engaged with a corresponding protrusion on each corresponding side portion of the connecting portion so as to restrict relative movement between the cover and the base portion along the front-to-back direction.

15. The transceiver module as claimed in claim 11, wherein the cover is terminated not to reach the inner mating portion in said front-to-back direction.

16. The transceiver module as claimed in claim 15, wherein in the vertical direction a maximum height of the outer mating port of the base portion is similar to a height of each of said side walls of the cover.

17. A transceiver module comprising:
a printed circuit board including opposite inner end portion and outer end portion in a front-to-back direction;
a metallic housing enclosing said printed circuit board and including a metallic base portion made by a metallic die-casting process with strong rigidity thereof, and a metallic cover assembled, in a vertical direction perpendicular to said front-to-back direction, upon the base portion and made by stamping and forming sheet metal with resiliency thereof;
said base portion including an inner mating port in which said inner end portion of the printed circuit board is located, an outer mating port around which said outer end portion of the printed circuit board is located, and a connecting portion located between said inner mating port and said outer mating port in said front-to-back direction; wherein
the inner mating port defines a three-sided structure to efficiently sidewardly and downwardly protectively shield the inner end portion of the printed circuit board; wherein
the cover includes a bottom wall and two opposite side walls assembled upon the connecting portion to commonly form a hollow configured to have the printed circuit board loaded therein along the vertical direction; wherein
the connecting portion defines a pair of side portions opposite to each other in a transverse direction perpendicular to both said vertical direction and said front-to-back direction with a height much less than those of both said outer mating port and said inner mating port in the vertical direction.

18. The transceiver module as claimed in claim 17, wherein the cover is terminated not to reach the inner mating portion in said front-to-back direction.

19. The transceiver module as claimed in claim 17, wherein in the vertical direction a maximum height of the outer mating port of the base portion is similar to a height of each of said side walls of the cover.

20. The transceiver module as claimed in claim 17, wherein each of said side walls of the cover includes a horizontal fixing ring engaged with a corresponding protrusion on each corresponding side portion of the connecting portion so as to restrict relative movement between the cover and the base portion along the front-to-back direction.

* * * * *